(12) United States Patent
Son et al.

(10) Patent No.: US 11,756,817 B2
(45) Date of Patent: Sep. 12, 2023

(54) APPARATUS AND METHOD FOR PROCESSING SUBSTRATE

(71) Applicant: Semes Co., Ltd, Cheonan-si (KR)

(72) Inventors: Dukhyun Son, Cheonan-si (KR); Sunghwan Hong, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 558 days.

(21) Appl. No.: 16/811,133

(22) Filed: Mar. 6, 2020

(65) Prior Publication Data
US 2020/0294830 A1    Sep. 17, 2020

(30) Foreign Application Priority Data

Mar. 13, 2019  (KR) .......................... 10-2019-0028919

(51) Int. Cl.
*H01L 21/673*  (2006.01)
*H01L 21/67*  (2006.01)
(Continued)

(52) U.S. Cl.
CPC .... *H01L 21/67389* (2013.01); *H01J 37/3244* (2013.01); *H01L 21/6719* (2013.01); (Continued)

(58) Field of Classification Search
CPC ........... H01L 21/67389; H01L 21/6719; H01L 21/67742; H01L 21/67766; H01L 21/67769; H01J 37/32724; H01J 37/32899
See application file for complete search history.

(56) References Cited

U.S. PATENT DOCUMENTS 11,189,511 B2 * 11/2021 Reuter .............. H01L 21/67389
11,244,844 B2 * 2/2022 Reuter .............. H01L 21/67769
(Continued)

FOREIGN PATENT DOCUMENTS

JP        2004158625 A    6/2004
KR       100778394 B1    11/2007
(Continued)

OTHER PUBLICATIONS

Korean Notice of Allowance dated Oct. 22. 2020 issued in corresponding Korean Appln. No. 10-2019-0028919.

*Primary Examiner* — Jarrett J Stark
(74) *Attorney, Agent, or Firm* — Harness, Dickey & Pierce, P.L.C.

(57) ABSTRACT

The inventive concept provides an apparatus and method for processing a substrate. The apparatus includes an index module and a processing module that is disposed adjacent to the index module and that processes the substrate. The index module includes one or more load ports, on each of which a carrier having the substrate received therein is placed, a side storage that stores the substrate subjected to a process in the processing module and removes fumes on the substrate, and a transfer frame including an index robot that transfers the substrate between the carrier placed on the load port, the side storage, and the processing module. The side storage includes a housing having an interior space, a partitioning unit that partitions the interior space into a plurality of receiving spaces independent of one another, and an exhaust unit that independently and separately evacuates the plurality of receiving spaces.

19 Claims, 10 Drawing Sheets

(51) Int. Cl.
    *H01J 37/32*    (2006.01)
    *H01L 21/677*    (2006.01)

(52) U.S. Cl.
    CPC .. *H01L 21/67383* (2013.01); *H01L 21/67742* (2013.01); *H01L 21/67766* (2013.01); *H01L 21/67769* (2013.01)

(56) References Cited

U.S. PATENT DOCUMENTS

| | | | | |
|---|---|---|---|---|
| 11,373,891 | B2 * | 6/2022 | Reuter | H01L 21/67393 |
| 2018/0374733 | A1 * | 12/2018 | Pannese | H01L 21/67778 |
| 2020/0135499 | A1 * | 4/2020 | Pannese | B01D 46/0039 |
| 2020/0135521 | A1 * | 4/2020 | Reuter | B01D 53/02 |
| 2020/0135522 | A1 * | 4/2020 | Reuter | H01L 21/67196 |
| 2020/0135525 | A1 * | 4/2020 | Reuter | H01L 21/67126 |
| 2020/0294830 | A1 * | 9/2020 | Son | H01J 37/3244 |
| 2020/0324410 | A1 * | 10/2020 | Bergantz | B25J 9/1664 |
| 2020/0343119 | A1 * | 10/2020 | Bergantz | H01L 21/67781 |
| 2021/0257233 | A1 * | 8/2021 | Narasimhan | H01L 21/67196 |
| 2022/0113208 | A1 * | 4/2022 | Lin | G01L 11/04 |
| 2022/0172968 | A1 * | 6/2022 | Lin | G01F 15/063 |
| 2022/0198333 | A1 * | 6/2022 | Pack | G06K 9/6256 |

FOREIGN PATENT DOCUMENTS

| | | |
|---|---|---|
| KR | 20140019028 A | 2/2014 |
| KR | 10-2014-0028580 A | 3/2014 |
| KR | 101374668 B1 | 3/2014 |
| KR | 10-2014-0079085 A | 6/2014 |
| KR | 10-2016-0046302 A | 4/2016 |
| KR | 101682473 B1 | 12/2016 |
| KR | 101688620 B1 | 12/2016 |
| KR | 101865636 B1 | 6/2018 |

* cited by examiner

APPARATUS AND METHOD FOR PROCESSING SUBSTRATE

CROSS-REFERENCE TO RELATED APPLICATIONS

A claim for priority under 35 U.S.C. § 119 is made to Korean Patent Application No. 10-2019-0028919 filed on Mar. 13, 2019, in the Korean Intellectual Property Office, the entire contents of which are hereby incorporated by reference.

BACKGROUND

Embodiments of the inventive concept described herein relate to an apparatus and method for processing a substrate.

To manufacture semiconductor devices, various processes such as a photolithography process, an etching process, an ashing process, an ion implantation process, a thin-film deposition process and the like are performed to form a pattern on a substrate. Among these processes, the etching process, the ion implantation process, and the thin-film deposition process are performed on the substrate in a vacuum atmosphere. When the substrate is moved from the vacuum atmosphere to an atmospheric atmosphere and exposed to oxygen, particles and fumes are formed on the substrate. Therefore, after the substrate processing processes, a process of removing the particles and the fumes is performed while the substrate is stored in a buffer unit.

The buffer unit includes a housing having an interior space. The interior space of the housing is provided as a space in which a plurality of substrates are received. FIG. 1 is a perspective view illustrating a general buffer unit. Referring to FIG. 1, particles and fumes remaining on substrates are removed by filling an interior space 6 of a housing 4 with a gas, evacuating the interior space 6, and adjusting the temperature in the interior space 6. The housing 4 has the shape of a container extending in the vertical direction, and the substrates are received in the interior space 6 so as to be arranged in the vertical direction.

Substrate processing throughput is improved due to the structure of the buffer unit 2 in which the plurality of substrates are simultaneously received. However, a deviation in the flow rate of gas and a temperature deviation occur depending on the positions in which the substrates are placed. Due to this, efficiency in removing the particles and the fumes may vary depending on the positions of the substrates.

Furthermore, in the case of removing particles and fumes in the state in which only a portion of the interior space 6 of the housing 4 is filled with substrates, there is a large difference between the area in which the substrates are received and the area in which the substrates are not received.

SUMMARY

Embodiments of the inventive concept provide an apparatus for processing a plurality of substrates received in a housing without a deviation depending on positions.

Embodiments of the inventive concept provide an apparatus and method for processing a substrate.

According to an exemplary embodiment, the apparatus for processing the substrate includes an index module and a processing module that is disposed adjacent to the index module and that processes the substrate. The index module includes one or more load ports, on each of which a carrier having the substrate received therein is placed, a side storage that stores the substrate subjected to a process in the processing module and removes fumes on the substrate, and a transfer frame having an index robot installed therein, in which the index robot transfers the substrate between the carrier placed on the load port, the side storage, and the processing module. The side storage includes a housing having an interior space, a partitioning unit that partitions the interior space into a plurality of receiving spaces independent of one another, and an exhaust unit that independently and separately evacuates the plurality of receiving spaces.

The partitioning unit may be provided such that the plurality of receiving spaces are stacked one above another.

The partitioning unit may include a partitioning plate that partitions the interior space and a first temperature adjustment member that adjusts temperature of the partitioning plate.

The side storage may further include a gas supply unit that supplies a gas into the plurality of receiving spaces, and the gas supply unit may include a gas supply line connected to the plurality of receiving spaces and a second temperature adjustment member installed on the gas supply line to adjust temperature of the gas.

The apparatus may further include a controller that controls the exhaust unit, and the controller may differently adjust amounts of gas discharged from the plurality of receiving spaces.

The processing module includes a plurality of process units that perform N different processes (N being an integer greater than 1), and M receiving spaces (M being an integer greater than or equal to N) may be provided.

According to an exemplary embodiment, a method for processing a substrate using the apparatus includes a processing step of processing the substrate in the processing module and a post-processing step of post-processing the substrate in the plurality of receiving spaces after the processing step, and the plurality of receiving spaces are independently and separately evacuated.

In the post-processing step, a first substrate may be received in a first space that is one of the plurality of receiving spaces, and a second substrate may be received in a second space that is another one of the plurality of receiving spaces. In the processing step, the first substrate and the second substrate may be subjected to different processes. Amounts of gas discharged from the first space and the second space may differ from each other.

In the post-processing step, the substrate may be received in each of the plurality of receiving spaces. The substrate received in each of the plurality of receiving spaces may be subjected to the same process in the processing step. Amounts of gas discharged from the plurality of receiving spaces may be identically adjusted.

The plurality of receiving spaces may be partitioned from one another by a temperature-adjustable partitioning plate, and temperatures of the plurality of receiving spaces may be identically adjusted by the partitioning plate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
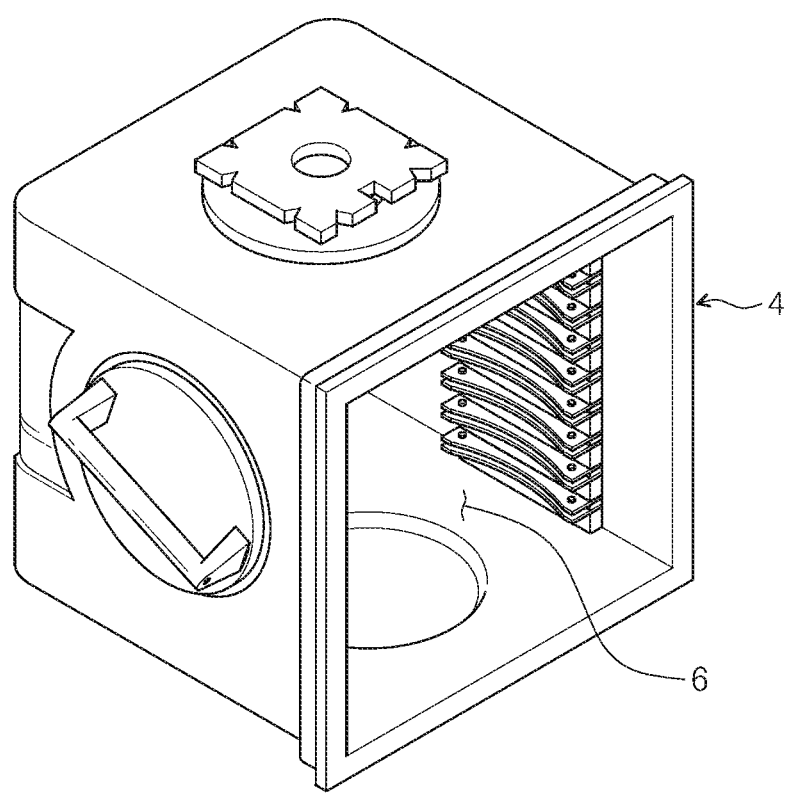
FIG. 1 is a perspective view illustrating a general buffer unit;_

Various modifications and variations can be made to embodiments of the inventive concept, and the scope of the inventive concept should not be construed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

Hereinafter, a substrate processing apparatus for etching a substrate using plasma according to an embodiment of the inventive concept will be described. Without being limited thereto, however, the inventive concept is applicable to various types of apparatuses for processing a substrate using a gas.

Figure 2:
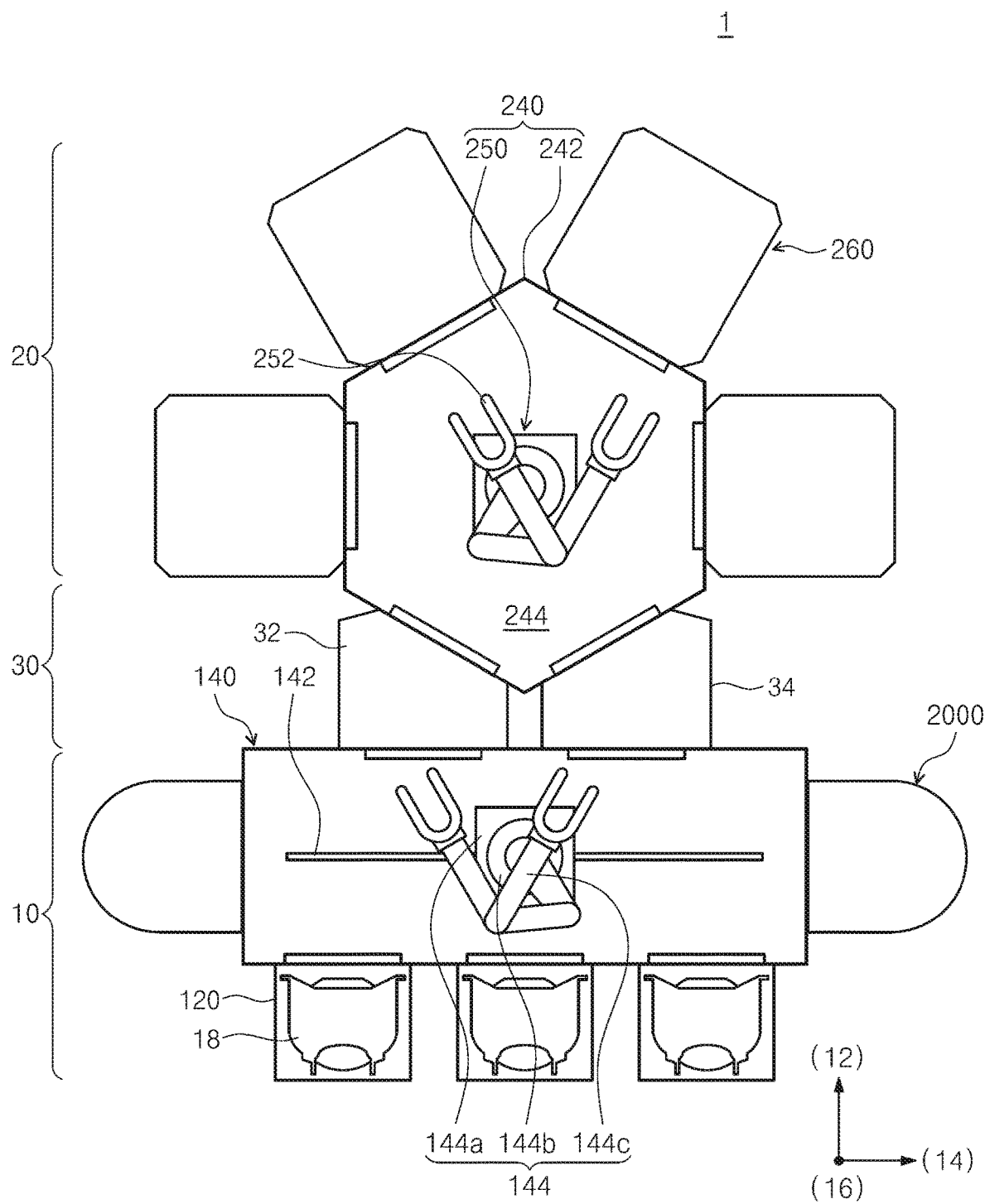
FIG. 2 is a schematic plan view illustrating substrate processing equipment according to an embodiment of the inventive concept.

FIG. 2 is a schematic plan view illustrating substrate processing equipment according to an embodiment of the inventive concept.

Referring to FIG. 2, the substrate processing equipment 1 has an index module 10, a loading module 30, and a processing module 20, and the index module 10 has load ports 120, a transfer frame 140, and a buffer unit 2000. The load ports 120, the transfer frame 140, the loading module 30, and the processing module 20 are sequentially arranged in a row. Hereinafter, the direction in which the load ports 120, the transfer frame 140, the loading module 30, and the processing module 20 are arranged is referred to as the first direction 12, the direction perpendicular to the first direction 12 when viewed from above is referred to as the second direction 14, and the direction perpendicular to the plane including the first direction 12 and the second direction 14 is referred to as the third direction 16.

Carriers 18, each of which has a plurality of substrates W received therein, are placed on the load ports 120. The load ports 120 are arranged in a row along the second direction 14. FIG. 2 illustrates one example that the index module 10 has three load ports 120. However, the number of load ports 120 may be increased or decreased depending on conditions such as the process efficiency and footprint of the processing module 20. Slots (not illustrated) that support the edges of the substrates W are formed in each of the carriers 18. The slots are arranged along the third direction 16, and the substrates W are stacked one above another with a spacing gap therebetween in the carrier 18 along the third direction 16. A front opening unified pod (FOUP) may be used as the carrier 18.

The transfer frame 140 transfers the substrates W between the carriers 18 placed on the load ports 120, the buffer unit 2000, and the loading module 30. An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves along the index rail 142 in the second direction 14. The index robot 144 includes a base 144a, a body 144b, and index arms 144c. The base 144a is installed so as to be movable along the index rail 142. The body 144b is coupled to the base 144a. The body 144b is movable on the base 144a along the third direction 16. Furthermore, the body 144b is rotatable on the base 144a. The index arms 144c are coupled to the body 144b and are movable forward and backward relative to the body 144b. The index arms 144c are individually driven. The index arms 144c are stacked one above another with a spacing gap therebetween along the third direction 16. Some of the index arms 144c may be used to transfer the substrates W from the processing module 20 to the carriers 18, and the other index arms 144c may be used to transfer the substrates W from the carriers 18 to the processing module 20. Accordingly, particles generated from the substrates W that are to be processed may be prevented from adhering to the processed substrates W in the process in which the index robot 144 transfers the substrates W between the carriers 18 and the processing module 20.

The buffer unit 2000 temporarily stores the substrates W processed in the processing module 20. The buffer unit 2000 removes process by-products remaining on the substrates W. The removal of the process by-products in the buffer unit 2000 may be performed by raising or lowering the pressure in the buffer unit 2000. A plurality of buffer units 2000 may be provided. For example, two buffer units 2000 may be provided. The two buffer units 2000 may be provided as side storages 2000 located on opposite sides of the transfer frame 140. The two buffer units 2000 may be located to face each other, with the transfer frame 140 therebetween. Alternatively, only one buffer unit 2000 may be provided on one side of the transfer frame 140.

The loading module 30 is disposed between the transfer frame 140 and a transfer chamber 242. The loading module 30 provides a space in which the substrates W stay before transferred between the transfer chamber 242 and the transfer frame 140. The loading module 30 includes a load-lock chamber 32 and an unload-lock chamber 34. The load-lock chamber 32 and the unload-lock chamber 34 are provided such that the insides thereof can be switched between a vacuum atmosphere and an atmospheric atmosphere.

The load-lock chamber 32 provides a space in which a substrate W to be transferred from the index module 10 to the processing module 20 temporarily stays. When the substrate W is placed in the load-lock chamber 32, the interior space of the load-lock chamber 32 is sealed from the index module 10 and the processing module 20. Thereafter, the interior space of the load-lock chamber 32 is switched from an atmospheric atmosphere to a vacuum atmosphere, and the load-lock chamber 32 is open to the processing module 20 in the state of being sealed from the index module 10.

The unload-lock chamber 34 provides a space in which a substrate W to be transferred from the processing module 20 to the index module 10 temporarily stays. When the substrate W is placed in the unload-lock chamber 34, the interior space of the unload-lock chamber 34 is sealed from the index module 10 and the processing module 20. Thereafter, the interior space of the unload-lock chamber 34 is switched from a vacuum atmosphere to an atmospheric atmosphere, and the unload-lock chamber 34 is open to the index module 10 in the state of being sealed from the processing module 20.

The processing module 20 includes the transfer chamber 242 and a plurality of process units 260.

The transfer chamber 242 transfers substrates W between the load-lock chamber 32, the unload-lock chamber 34, and the plurality of process units 260. The transfer chamber 242 may have a hexagonal shape when viewed from above. Alternatively, the transfer chamber 242 may have a rectangular or pentagonal shape. The load-lock chamber 32, the unload-lock chamber 34, and the plurality of process units 260 are located around the transfer chamber 242. A transfer robot 250 is provided in the transfer chamber 242. The transfer robot 250 may be located in the center of the transfer chamber 242. The transfer robot 250 may have a plurality of hands 252 that are movable in the horizontal and vertical directions and are movable forward or backward or rotatable on the horizontal plane. The hands 252 may be independently driven, and substrates W may be seated on the hands 252 in a horizontal state.

Gas processing apparatuses 1000 provided in the process units 260 will be described below. The gas processing apparatuses 1000 perform an etching or deposition process on a substrate W. According to an embodiment, the gas processing apparatuses 1000 may perform different processes. Among the gas processing apparatuses 1000, a first apparatus may perform a first process of supplying a first gas, and a second apparatus may perform a second process of supplying a second gas. The first gas may include fluorine (F), chlorine (Cl), or bromine (Br), and the second gas may include ammonia ($NH_3$).

Figure 3:
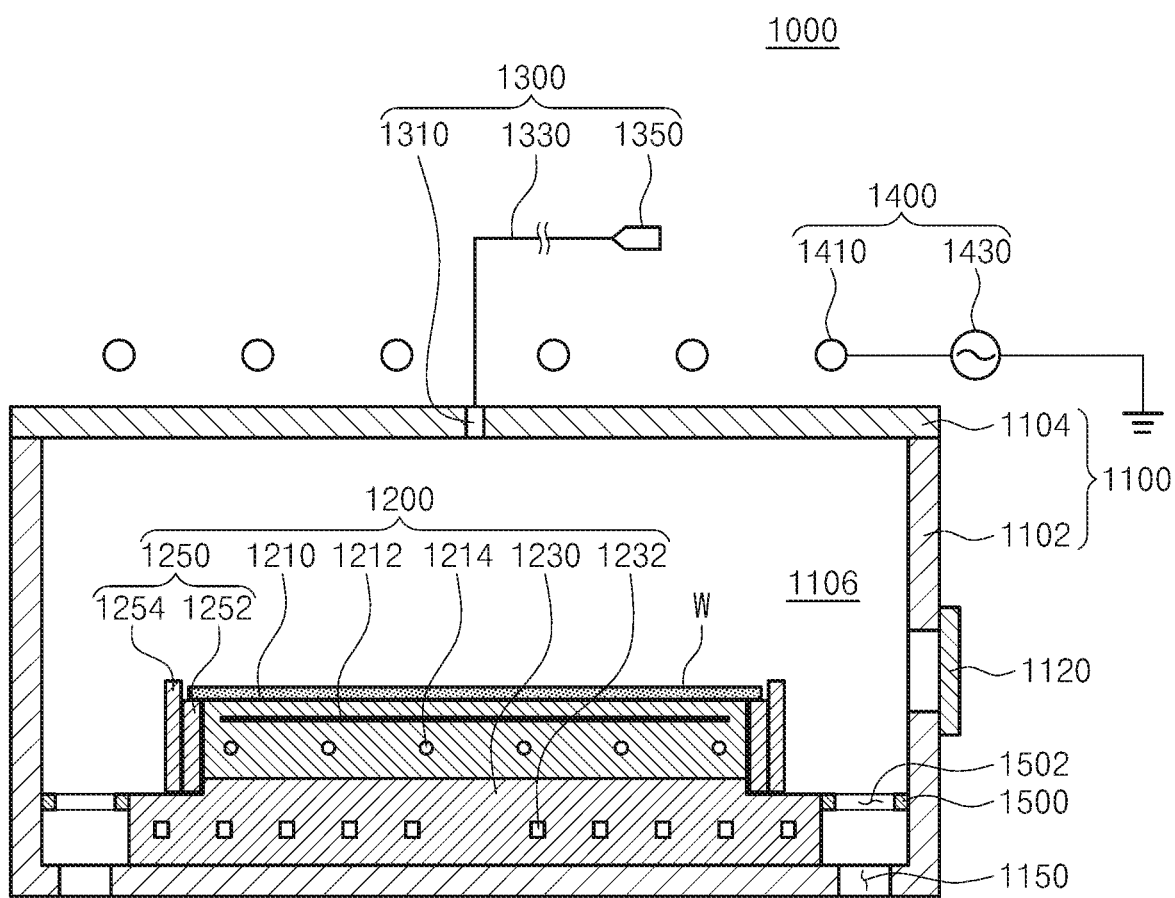
FIG. 3 is a sectional view of a gas processing apparatus of FIG. 2.

FIG. 3 is a sectional view of the gas processing apparatus of FIG. 2. Referring to FIG. 3, the gas processing apparatus 1000 includes a chamber 1100, a substrate support unit 1200, a gas supply unit 1300, a plasma source 1400, and an exhaust baffle 1500.

The chamber 1100 has a processing space 1106 in which a substrate W is processed. The chamber 1100 has a cylindrical shape. The chamber 1100 is formed of a metallic material. For example, the chamber 1100 may be formed of an aluminum material. The chamber 1100 has an opening formed in a sidewall 1102.

The opening functions as an entrance through which the substrate W is placed in or extracted from the chamber 1100. The opening is opened or closed by a door 1120. A lower hole 1150 is formed in the bottom of the chamber 1100. A pressure-reducing member (not illustrated) is connected to the lower hole 1150. The processing space 1106 of the chamber 1100 may be evacuated by the pressure-reducing member and may be maintained in an atmosphere of reduced pressure during a process.

The substrate support unit 1200 supports the substrate W in the processing space 1106. The substrate support unit 1200 may be an electrostatic chuck 1200 that supports the substrate W using an electrostatic force. Alternatively, the substrate support unit 1200 may support the substrate W in various manners such as mechanical clamping.

The electrostatic chuck 1200 includes a dielectric plate 1210, a base 1230, and a focus ring 1250. The dielectric plate 1210 may be formed of a dielectric substance. The substrate W is directly placed on an upper surface of the dielectric plate 1210. The dielectric plate 1210 has a circular plate shape. The dielectric plate 1210 may have a smaller radius than the substrate W. An electrode 1212 for chucking is installed in the dielectric plate 1210. A power supply (not illustrated) is connected to the electrode 1212 for chucking. Power is applied from the power supply (not illustrated) to the electrode 1212, and the substrate W is clamped to the dielectric plate 1210 by an electrostatic force. A heater 1214 for heating the substrate W is installed in the dielectric plate 1210. The heater 1214 is located under the electrode 1212 for chucking. The heater 1214 may be implemented with a coil in a spiral shape.

The base 1230 supports the dielectric plate 1210. The base 1230 is located under the dielectric plate 1210 and is fixedly coupled with the dielectric plate 1210. An upper surface of the base 1230 has a stepped shape such that the central region is located in a higher position than the edge region. The central region of the upper surface of the base 1230 has an area corresponding to that of a bottom surface of the dielectric plate 1210. A cooling fluid channel 1232 is formed in the base 1230. The cooling fluid channel 232 serves as a passage through which a cooling fluid circulates. The cooling fluid channel 1232 may be provided in a spiral shape in the base 1230. The base 1230 is connected with an RF power supply 1234 located outside. The RF power supply 1234 applies power to the base 1230. The power applied to the base 1230 guides plasma generated in the chamber 1100 toward the base 1230. The base 1230 may be formed of a metallic material.

The focus ring 1250 concentrates the plasma on the substrate W. The focus ring 1250 includes an inner ring 1252 and an outer ring 1254. The inner ring 1252 has an annular ring shape that surrounds the dielectric plate 1210. The inner ring 1252 is located on the edge region of the base 1230. The inner ring 1252 has an upper surface at the same height as the upper surface of the dielectric plate 1210. An inner portion of the upper surface of the inner ring 1252 supports the edge region of the backside of the substrate W. For example, the inner ring 1252 may be formed of a conductive material. The outer ring 1254 has an annular ring shape that surrounds the inner ring 1252. The outer ring 1254 is located adjacent to the inner ring 1252 on the edge region of the base 1230. The outer ring 1254 has an upper end in a higher position than an upper end of the inner ring 1252. The outer ring 1254 may be formed of an insulating material.

The gas supply unit 1300 supplies a process gas onto the substrate W supported on the substrate support unit 1200. The gas supply unit 1300 includes a gas reservoir 1350, a gas supply line 1330, and a gas intake port 1310. The gas supply line 1330 connects the gas reservoir 1350 and the gas intake port 1310. The process gas stored in the gas reservoir 1350 is supplied to the gas intake port 1310 through the gas supply line 1330. The gas intake port 1310 is installed in an upper wall 1104 of the chamber 1100. The gas intake port 1310 is located to face the substrate support unit 1200. According to an embodiment, the gas intake port 1310 may be installed in the center of the upper wall 1104 of the chamber 1100. A valve may be installed in the gas supply line 1330 to open or close the inner passage of the gas supply line 1330 or to regulate the flow rate of the process gas flowing through the inner passage of the gas supply line 1330. For example, the process gas may be an etching gas.

The plasma source 1400 excites the process gas in the chamber 1100 into a plasma state. An inductively coupled plasma (ICP) source may be used as the plasma source 1400. The plasma source 1400 includes an antenna 1410 and an external power supply 1430. The antenna 1410 is disposed over the chamber 1100. The antenna 1410 is provided in a spiral shape wound a plurality of times and is connected with the external power supply 1430. The antenna 1410 receives power from the external power supply 1430. The antenna 1410 to which the power is applied forms a discharge space in the interior space of the chamber 1100. The process gas staying in the discharge space may be excited into a plasma state.

The exhaust baffle 1500 uniformly releases the plasma from the processing space 1106 by region. The exhaust baffle 1500 has an annular ring shape. In the processing space 1106, the exhaust baffle 1500 is located between an inner wall of the chamber 1100 and the substrate support unit 1200. The exhaust baffle 1500 has a plurality of exhaust holes 1502 formed therein. The exhaust holes 1502 are directed in the vertical direction. The exhaust holes 1502 extend from the top of the exhaust baffle 1500 to the bottom thereof. The exhaust holes 1502 are spaced apart from each other along the circumferential direction of the exhaust baffle 1500. Each of the exhaust holes 1502 has a slit shape and has a lengthwise direction directed in the radial direction.

Figure 4:
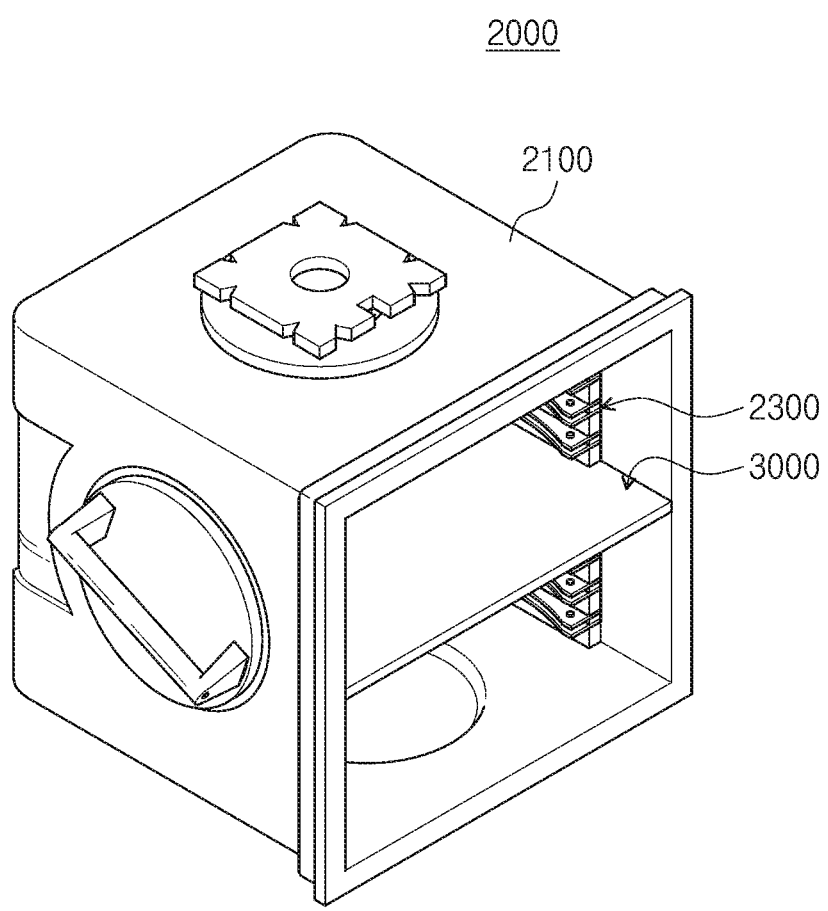
FIG. 4 is a perspective view illustrating a buffer unit of FIG. 2.
Figure 5:
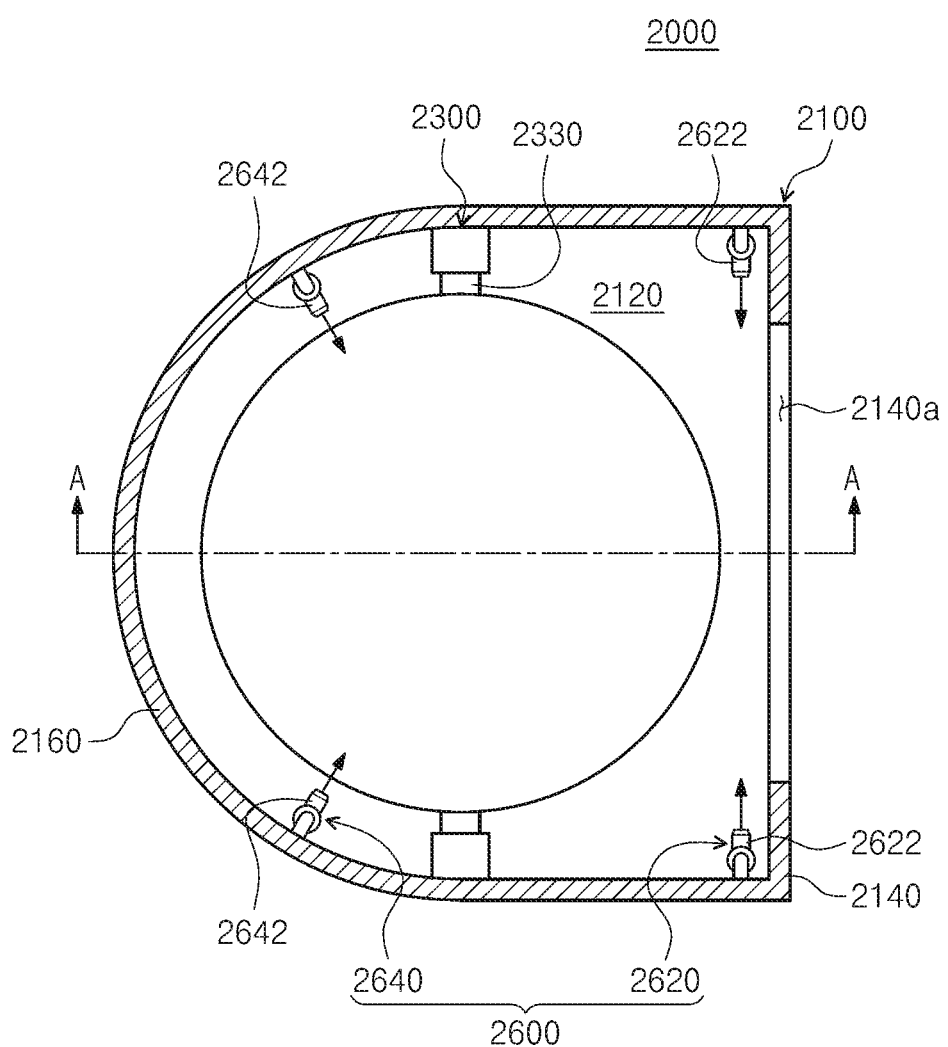
FIG. 5 is a plan view illustrating the buffer unit of FIG. 4.
Figure 6:
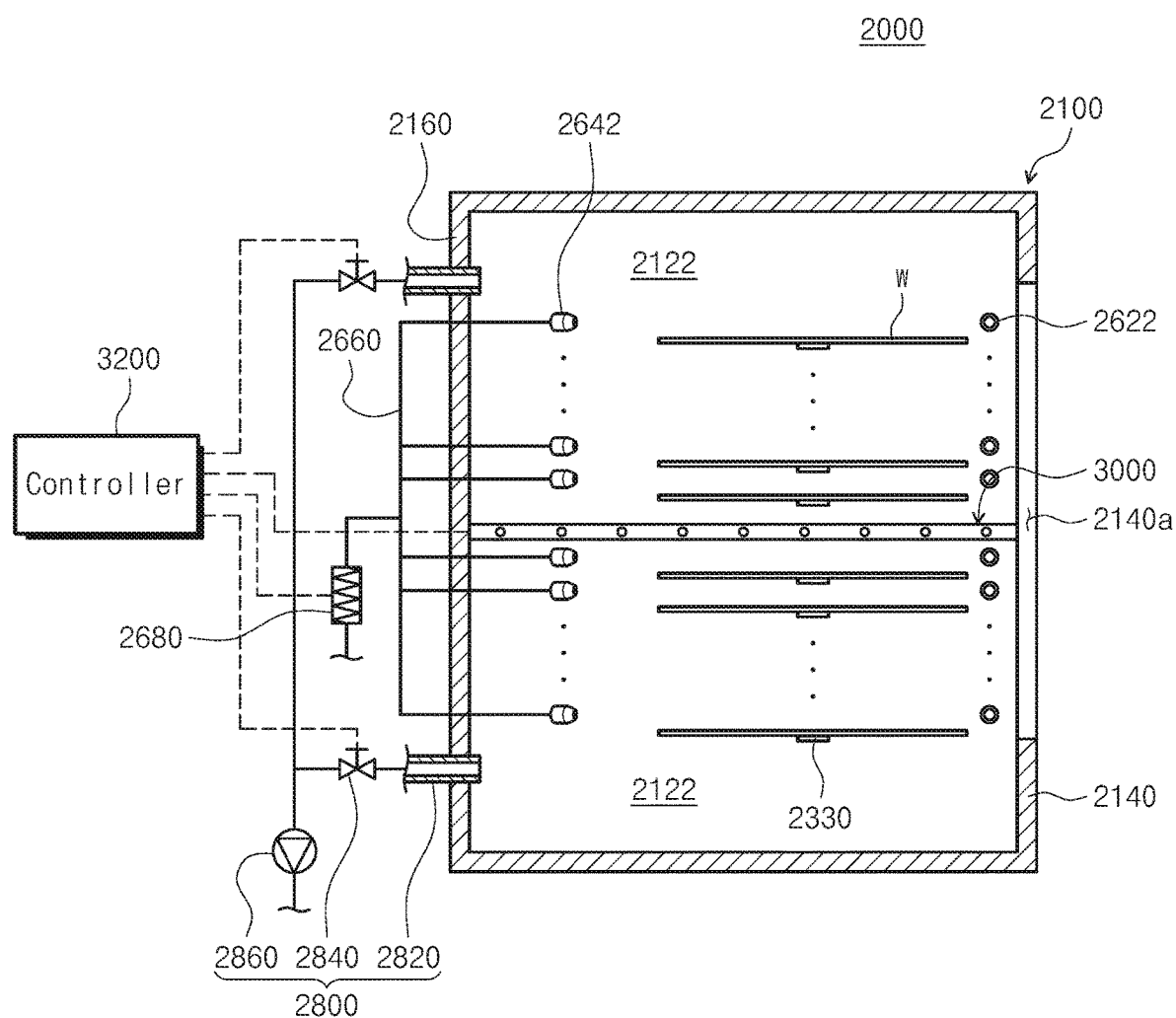
FIG. 6 is a sectional view taken along line A-A of FIG. 4.

Next, the transfer unit 2000 mentioned above will be described in more detail. FIG. 4 is a perspective view illustrating the buffer unit of FIG. 2. FIG. 5 is a plan view illustrating the buffer unit of FIG. 4. FIG. 6 is a sectional view taken along line A-A of FIG. 4. Referring to FIGS. 4 to 6, the buffer unit 2000 includes a housing 2100, a substrate support unit 2300, a gas supply unit 2600, an exhaust unit 2800, a partitioning unit 3000, and a controller 3200.

The housing 2100 has the shape of a container with a buffer space 2120 inside. The housing 2100 has a lengthwise direction directed in the third direction 16. The buffer space 2120 is partitioned into a plurality of receiving spaces 2122 independent of one another by the partitioning unit 3000. The receiving spaces 2122 are provided as spaces in which to receive a plurality of substrates W. The housing 2100 has an open face 2140 on one side thereof. The open face 2140 faces the transfer frame 140. The open face 2140 functions as an entrance 2140a through which the substrates W are transferred between the transfer frame 140 and the buffer space 2120. A heater (not illustrated) may be installed in a sidewall of the housing 2100 to heat the buffer space 2120.

The substrate support unit 2300 supports a substrate W in the buffer space 2120. The substrate support unit 2300 supports a plurality of substrates W. The plurality of substrates W are located to be arranged in the vertical direction by the substrate support unit 2300. The substrate support unit 2300 includes a plurality of support slots 2330. The support slots 2330 have seating surfaces on which the substrates W are seated, respectively. Here, the seating surfaces may be upper surfaces of the support slots 2330. The support slots 2330 protrude from an inner surface of the housing 2100. Two support slots 2330 located at the same height face each other when viewed from above. Furthermore, the support slots 2330 are located to be spaced apart from each other along the third direction 16. The support slots 2330 may be spaced apart from each other at equal intervals in the third direction 16. Accordingly, the plurality of substrates W may be supported on the substrate support unit 2300 in a state of being stacked one above another. Alternatively, three or more support slots 2330 may be provided when viewed from above.

The gas supply unit 2600 supplies a purge gas into the buffer space 2120. Contaminants remaining on the substrates W may be purged by the purge gas supplied from the gas supply unit 2600. Furthermore, infiltration of external contaminants into the buffer space 2120 may be minimized by the purge gas supplied into the buffer space 2120. The gas supply unit 2600 includes a first supply unit 2620, a second supply unit 2640, a gas supply line 2660, and a heater 2680. The first supply unit 2620 has a plurality of first gas nozzles 2622, and the second supply unit 2640 has a plurality of second gas nozzles 2642.

The first supply unit 2620 is located closer to the entrance 2140a than the second supply unit 2640 when viewed from above. The first gas nozzles 2622 are located on opposite sides of the entrance 2140a when the entrance 2140a is viewed from the front. The first gas nozzles 2622 located on the opposite sides may dispense the purge gas toward each other. The first gas nozzles 2622 may dispense the purge gas in the horizontal directions. The first gas nozzles 2622 may dispense the purge gas in directions parallel to the entrance 2140a or at acute angles with respect to the entrance 2140a. Accordingly, the first gas nozzles 2622 may interrupt infiltration of external contaminants into the buffer space 2120. Furthermore, the first gas nozzles 2622 are arranged to be spaced apart from each other in the vertical direction. For example, the interval between two first gas nozzles 2622 adjacent to each other in the vertical direction may be the same as the interval between two support slots 2330 adjacent to each other in the vertical direction.

The second gas nozzles 2642 are located to be spaced apart from each other in the vertical direction and are arranged to have the same interval as the first gas nozzles 2622. The second gas nozzles 2642 dispense the purge gas toward the substrates W when viewed from above. Due to this, contaminants remaining on the substrates W may be purged and cleaned. According to an embodiment, the second gas nozzles 2642 arranged in the vertical direction may be divided into a plurality of groups, and the plurality of groups of second gas nozzles 2642 may supply the purge gas toward the substrates W at various angles.

The gas supply line 2660 supplies the purge gas to the first supply unit 2620 and the second supply unit 2640. The gas supply line 2660 may supply the purge gas such that the same amount of purge gas is supplied into the receiving spaces 2122. For example, the purge gas may be an inert gas or air. The heater 2680 is installed on the gas supply line 2660. The heater 2680 heats the purge gas to a temperature higher than room temperature.

The exhaust unit 2800 evacuates the buffer space 2120. The exhaust unit 2800 discharges particles and fumes removed from the substrates W to the outside of the buffer space 2120. The exhaust unit 2800 includes gas exhaust lines 2820, exhaust valves 2840, and a pressure-reducing member 2860. The gas exhaust lines 2820 are connected to the respective receiving spaces 2122, and the exhaust valves 2840 are installed in the gas exhaust lines 2820 to separately regulate the amounts of gas discharged from the receiving spaces 2122. The pressure-reducing member 2860 reduces the pressure in the gas exhaust lines 2820 to evacuate the receiving spaces 2122. For example, the gas exhaust lines 2820 may be connected to the opposite face to the open face 2140.

Figure 7:
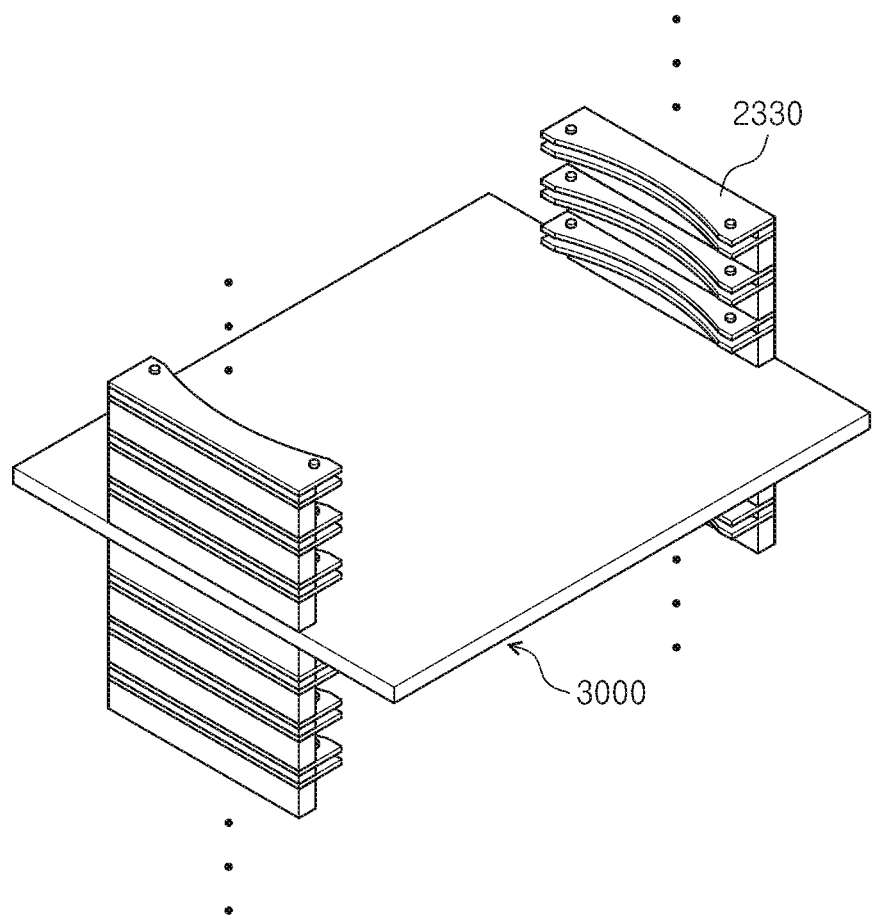
FIG. 7 is a perspective view illustrating a substrate support unit and a partitioning unit of FIG. 4.
Figure 8:
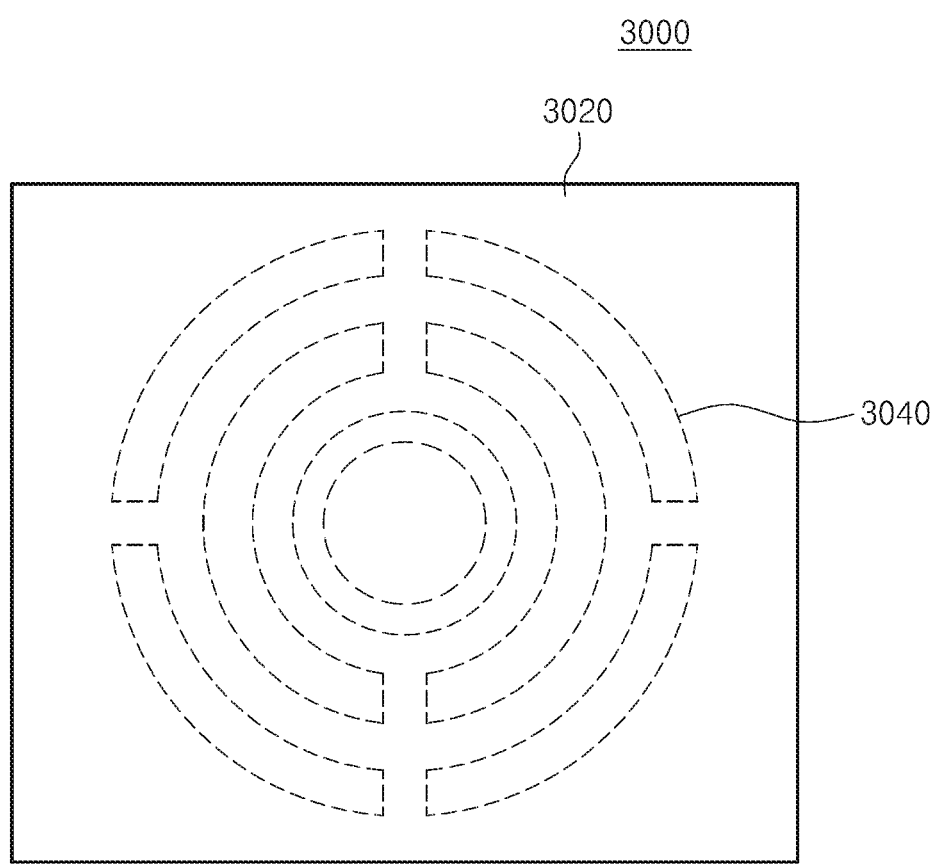
FIG. 8 is a plan view illustrating a partitioning plate and a first temperature adjustment member of FIG. 7.

The partitioning unit 3000 partitions the interior space of the housing 2100 into the plurality of independent receiving spaces 2122. The partitioning unit 3000 is located such that the plurality of receiving spaces 2122 are arranged to be stacked one above another. FIG. 7 is a perspective view illustrating the substrate support unit and the partitioning unit of FIG. 4, and FIG. 8 is a plan view illustrating a partitioning plate and a heating member of FIG. 7. Referring to FIGS. 7 and 8, a plurality of partitioning units 3000 are provided. The partitioning units 300 are located to be spaced apart from each other in the vertical direction. Each of the partitioning units 3000 includes the partitioning plate 3020 and the heating member 3040. The partitioning plate 3020 is implemented with a plate having the same shape as the housing 2100 when viewed from above. The partitioning plate 3020 may be provided to be detachable from the housing 2100. Due to this, the position of the partitioning plate 3020 may be changed, and the volumes of the receiving spaces 2122 may be varied. Furthermore, the number of receiving spaces 2122 may be adjusted by the number of partitioning plates 3020. For example, the same number of partitioning plates 3020 or more partitioning plates 3020 than the process units 260 may be provided. The heating member 3040 adjusts the temperature of the partitioning plate 3020. The heating member 3040 may be implemented with a heating wire 3040 installed in the partitioning plate 3020. According to an embodiment, the heating member 3040 may be provided as a first temperature adjustment member for adjusting the temperature of the receiving spaces 2122 to a first temperature, and the heater 2680 may be provided as a second temperature adjustment member 2680 for adjusting the temperature of the receiving spaces 2122 to a second temperature by using the purge gas. The first temperature and the second temperature may be equal to each other.

The controller 3200 controls the exhaust unit 2800 to adjust the amounts of gas discharged from the receiving spaces 2122. The controller 3200 may differently adjust the amounts of gas discharged from the receiving spaces 2122, depending on the substrates W located in the receiving spaces 2122. According to an embodiment, one of the plurality of receiving spaces 2122 may be provided as a first space 2122a, and another one may be provided as a second space 2122b. First substrates $W_1$ subjected to a first process may be placed in the first space 2122a, and second substrates $W_2$ subjected to a second process may be placed in the second space 2122b. The first process and the second process may differ from each other, and the amounts of gas discharged from the first space 2122a and the second space 2122b may be differently adjusted. That is, the amounts of gas discharged may be differently adjusted depending on the types of processes to which the substrates placed in the receiving spaces 2122 were subjected. Furthermore, the amounts of gas discharged may be differently adjusted depending on the types of used gases even though the substrates were subjected to the same process.

Hereinafter, a process of processing a substrate W using the above-described substrate processing equipment will be described. A method of processing the substrate W includes a processing step and a post-processing step. The processing step is a step of processing the substrate W using a gas in the processing module 20. Here, processing the substrate W in the processing module 20 includes processing the substrate W in a single process unit 260 or processing the substrate W in the plurality of process units 260. The substrate W subjected to the processing step is transferred into the buffer unit 2000 through the unload-lock chamber 34. The processing module 20 is in a vacuum state, whereas the index module 10 has an atmospheric pressure state. Due to this, a large amount of particles are attached to the substrate W transferred from the processing module 20 to the index module 10.

Figure 9:
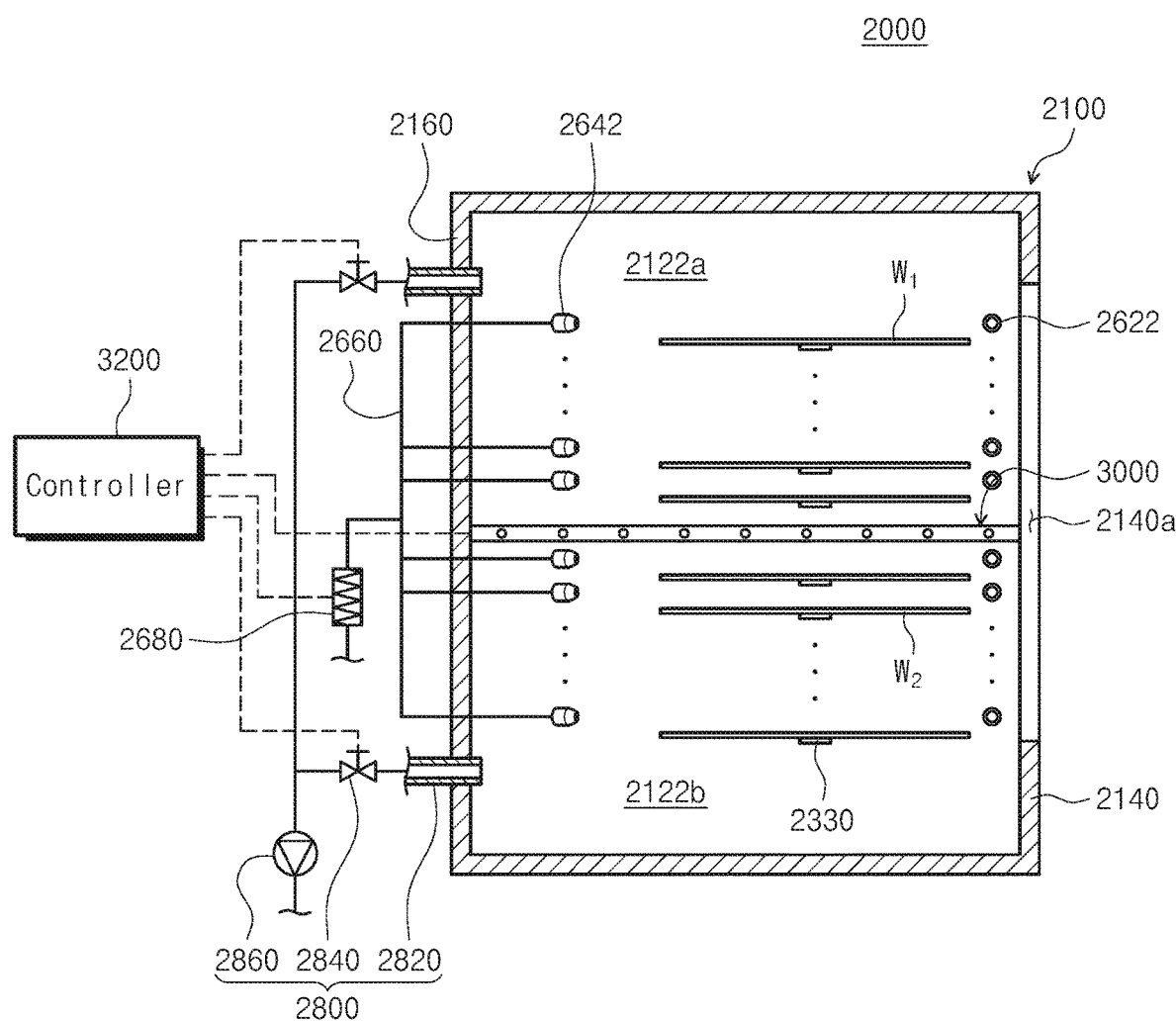
FIG. 9 is a view illustrating a state in which substrates subjected to different processes are received in the buffer unit of FIG. 4.

The post-processing step is a step of removing contaminants remaining on the substrate W. In the post-processing step, the substrate W is processed by supplying a purge gas to the substrate W and discharging the purge gas. Referring to FIG. 9, the first substrates $W_1$ subjected to the first process are transferred into the first space 2122a, which is one of the receiving spaces 2122, and the second substrates $W_2$ subjected to the second process are transferred into the second space 2122b, which is another one of the receiving spaces 2122. The first space 2122a and the second space 2122b are heated by the partitioning unit 3000 and the gas supply unit 2600. For example, the first space 2122a and the second space 2122b may be heated to the same temperature. Alternatively, the amounts of gas discharged from the first space 2122a and the second space 2122b may differ from each other. For example, the pressure in the first space 2122a may be higher than the pressure in the transfer frame 140, and the pressure in the second space 2122b may be lower than the pressure in the transfer frame 140.

Figure 10:
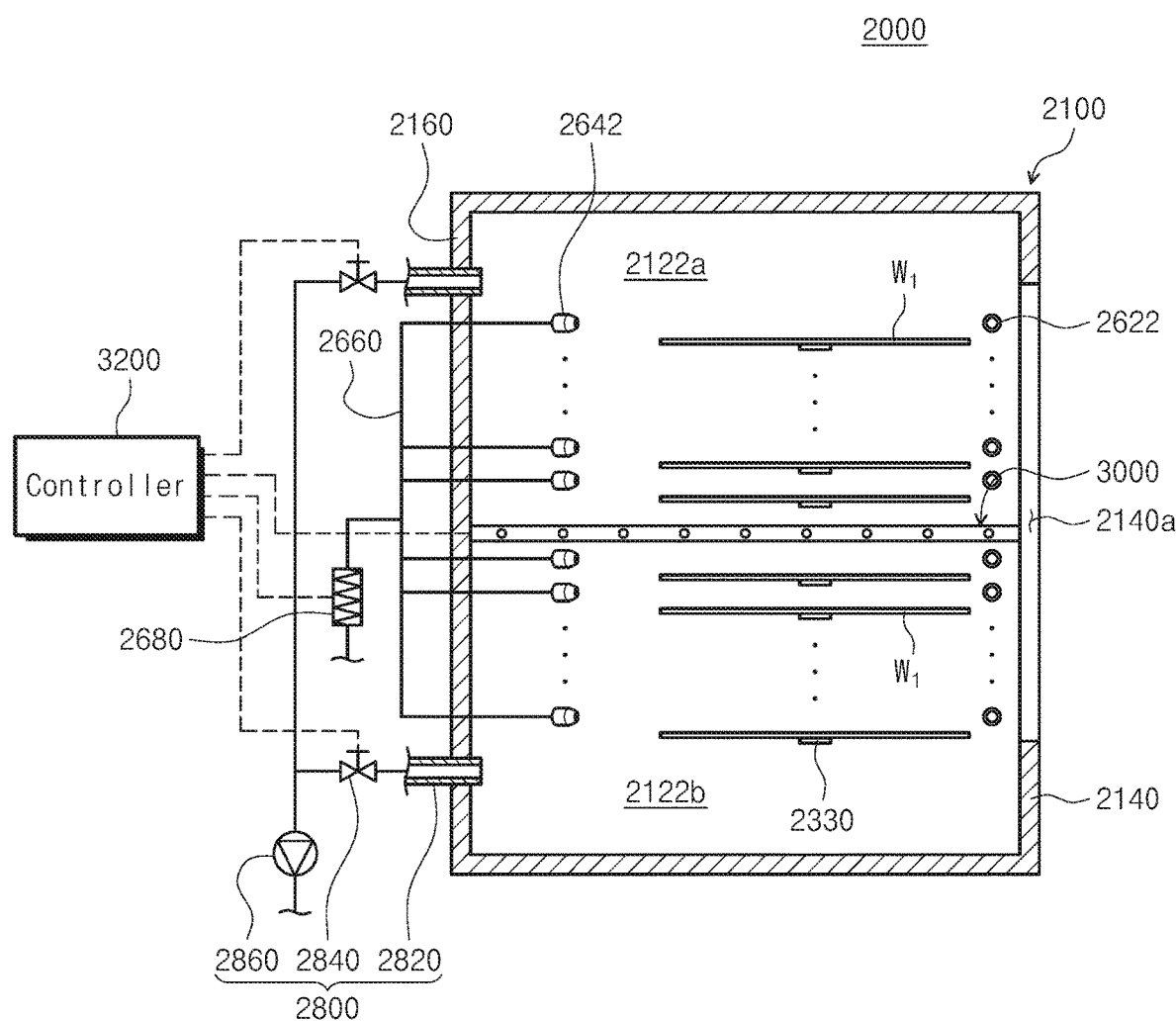
FIG. 10 is a view illustrating a state in which substrates subjected to the same process are received in the buffer unit of FIG. 4.

In the above-described embodiment, it has been described that the substrates W subjected to the different processes are transferred into the first space 2122a and the second space 2122b. However, as illustrated in FIG. 10, the substrates $W_1$ subjected to the same process may be transferred into the first space 2122a and the second space 2122b. In this case, the amounts of gas discharged from the first space 2122a and the second space 2122b may be the same as each other. The first space 2122a and the second space 2122b may be adjacent to each other. The first space 2122a and the second space 2122b may be partitioned from each other by the partitioning plate 3020. The first space 2122a may be an upper space, and the second space 2122b may be a lower space. The first space 2122a and the second space 2122b may be heated by the partitioning plate 3020. Accordingly, a temperature difference between an upper side of the first space 2122a and a lower side of the second space 2122b may be reduced.

According to the embodiments of the inventive concept, the interior space of the housing is partitioned into the receiving spaces by the partitioning plate. Accordingly, a plurality of substrates may be uniformly processed.

Furthermore, according to the embodiments of the inventive concept, the plurality of receiving spaces are separately evacuated, and substrates subjected to different processes are received in the plurality of receiving spaces. Accordingly, the substrates may be processed by varying amounts of gas discharged from the receiving spaces, depending on the pre-processing processes.

In addition, according to the embodiments of the inventive concept, the temperatures of the receiving spaces are adjusted by the partitioning plate and the gas. Accordingly, the temperatures of the receiving spaces may be uniformly adjusted.

The above description exemplifies the inventive concept. Furthermore, the above-mentioned contents describe the exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for processing a substrate, the apparatus comprising:
an index module; and
a processing module adjacent to the index module and configured to process the substrate,
wherein the index module includes:
one or more load ports, configured to have placed on each of which a carrier having the substrate received therein;
a side storage configured to store the substrate subjected to a process in the processing module and to remove fumes on the substrate; and
a transfer frame having an index robot installed therein, the index robot being configured to transfer the substrate between the carrier placed on the load port, the side storage, and the processing module,
wherein the side storage includes:
a housing having an interior space;
a partitioning unit including an adjustable partitioning plate, the partitioning unit configured to partition the interior space into a plurality of receiving spaces independent of one another; and
an exhaust unit configured to independently and separately evacuate the plurality of receiving spaces.

2. The apparatus of claim 1, wherein the partitioning unit is provided such that the plurality of receiving spaces are stacked one above another.

3. The apparatus of claim 1, wherein the side storage further includes a gas supply unit configured to supply a gas into the plurality of receiving spaces, and
wherein the gas supply unit includes:
a gas supply line connected to the plurality of receiving spaces; and
a second temperature adjustment member installed on the gas supply line and configured to adjust temperature of the gas.

4. The apparatus of claim 1, wherein the apparatus further comprises a controller configured to control the exhaust unit, and
wherein the controller is configured to differently adjust amounts of gas discharged from the plurality of receiving spaces.

5. The apparatus of claim 1, wherein the processing module includes a plurality of process units configured to perform N different processes (N being an integer greater than 1), and
wherein M receiving spaces (M being an integer greater than or equal to N) are provided.

6. The apparatus of claim 1, wherein the partitioning unit further includes a heating member, the heating member configured to adjust a temperature of the partitioning plate.

7. The apparatus of claim 6, further comprising:
a plurality of nozzles within the housing;
a gas supply line in fluid communication with the plurality of nozzles; and
a heater connected to the gas supply line.

8. The apparatus of claim 7, wherein
the heating member in the partitioning unit is configured to adjust a temperature of at least one of the plurality of receiving spaces to a first temperature by adjusting a heat of a heating coil, and
the heater that is connected to the gas supply line is configured to adjust the temperature of the at least one of the plurality of receiving spaces to a second temperature by adjusting a temperature of a purge gas, the purge gas introduced to the at least one of the plurality of receiving spaces through the gas supply line.

9. The apparatus of claim 8, wherein the first temperature is equal to the second temperature.

10. The apparatus of claim 8, wherein the heater is configured to adjust the temperature of the purge gas to be greater than room temperature.

11. The apparatus of claim 1, wherein the partitioning plate has a same shape as a shape of the housing, when viewed from above.

12. The apparatus of claim 1, wherein a first volume of a first one of the plurality of receiving spaces is different form a second volume of a second one of the plurality of receiving spaces, the first volume and the second volume based on a position of the partitioning plate within the housing.

13. The apparatus of claim 1, wherein the exhaust unit is directly connected to the plurality of receiving spaces.

14. The apparatus of claim 1, wherein the housing includes a handle.

15. The apparatus of claim 1, wherein a first one of the side storage is at one end of the transfer frame, and a second one of the side storage is at another end of the transfer frame.

16. An apparatus for processing a substrate, the apparatus comprising:
an index module; and
a processing module adjacent to the index module and configured to process the substrate,
wherein the index module includes:
one or more load ports, configured to have placed on each of which a carrier having the substrate received therein;
a side storage configured to store the substrate subjected to a process in the processing module and to remove fumes on the substrate; and
a transfer frame having an index robot installed therein, the index robot being configured to transfer the substrate between the carrier placed on the load port, the side storage, and the processing module,
wherein the side storage includes:
a housing having an interior space;
a partitioning unit including a detachable partitioning plate, the partitioning unit configured to partition the interior space into a plurality of receiving spaces independent of one another; and
an exhaust unit configured to independently and separately evacuate the plurality of receiving spaces,
wherein the partitioning unit is provided such that the plurality of receiving spaces are stacked one above another, and wherein the partitioning unit includes:
a first temperature adjustment member within the partitioning plate and configured to adjust temperature of the partitioning plate.

17. An apparatus for processing a substrate, the apparatus comprising:
an index module; and
a processing module adjacent to the index module and configured to process the substrate,
wherein the index module includes:
one or more load ports, configured to have placed on each of which a carrier having the substrate received therein;

a side storage configured to store the substrate subjected to a process in the processing module and to remove fumes on the substrate; and a transfer frame having an index robot installed therein, the index robot being configured to transfer the substrate between the carrier placed on the load port, the side storage, and the processing module, wherein the side storage includes:

a housing having an interior space;

a partitioning unit including an adjustable partitioning plate, the partitioning unit configured to partition the interior space into a plurality of receiving spaces independent of one another; and an exhaust unit configured to independently and separately evacuate the plurality of receiving spaces, wherein the partitioning unit includes a heating wire inside of the partitioning plate.

18. The apparatus of claim 17, wherein the partitioning unit is provided such that the plurality of receiving spaces are stacked one above another.

19. The apparatus of claim 17, wherein the partitioning plate has a same shape as a shape of the housing, when viewed from above.

* * * * *